(12) United States Patent
Chun et al.

(10) Patent No.: US 10,515,911 B2
(45) Date of Patent: Dec. 24, 2019

(54) SEMICONDUCTOR DEVICES

(71) Applicants: HyunSuk Chun, Yongin-si (KR);
Jong-Woo Park, Seongnam-si (KR);
Chul-Yong Park, Hwaseong-si (KR);
Jeong-Won Yoon, Suwon-si (KR)

(72) Inventors: HyunSuk Chun, Yongin-si (KR);
Jong-Woo Park, Seongnam-si (KR);
Chul-Yong Park, Hwaseong-si (KR);
Jeong-Won Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 827 days.

(21) Appl. No.: 14/832,306

(22) Filed: Aug. 21, 2015

(65) Prior Publication Data
US 2016/0133688 A1 May 12, 2016

(30) Foreign Application Priority Data
Nov. 7, 2014 (KR) ........................ 10-2014-0154464

(51) Int. Cl.
*H01L 23/00* (2006.01)
*H01L 23/522* (2006.01)
*H01L 23/532* (2006.01)

(52) U.S. Cl.
CPC .......... *H01L 24/05* (2013.01); *H01L 23/5223* (2013.01); *H01L 23/53223* (2013.01); *H01L 23/53238* (2013.01); *H01L 23/53266* (2013.01); *H01L 24/13* (2013.01); *H01L 2224/05012* (2013.01); *H01L 2224/05022* (2013.01); *H01L 2224/05124* (2013.01); *H01L 2224/05147* (2013.01); *H01L 2224/05166* (2013.01); *H01L 2224/05171* (2013.01); *H01L 2224/05184* (2013.01); *H01L 2224/05558* (2013.01);
(Continued)

(58) Field of Classification Search
CPC ........................................................ H01L 23/00
See application file for complete search history.

(56) References Cited

U.S. PATENT DOCUMENTS 6,794,262 B2    9/2004  Ning et al.
7,405,921 B2    7/2008  Kurihara et al.
(Continued)

FOREIGN PATENT DOCUMENTS

CN    101847629 A    9/2010
CN    104037170 A    9/2014
(Continued)

OTHER PUBLICATIONS

1st Office Action from the Chinese Patent Office for CN 201510750308.2 dated Nov. 26, 2018.

*Primary Examiner* — Marvin Payen
(74) *Attorney, Agent, or Firm* — Harness, Dickey & Pierce, P.L.C.

(57) ABSTRACT

Semiconductor devices include an interlayer insulating layer on a substrate, a first capacitor structure in the interlayer insulating layer, and a conductive layer including a terminal pad on the interlayer insulating layer. The first capacitor structure includes at least one first laminate, the at least one first laminate including a first lower electrode, a first capacitor insulating layer, and a first upper electrode sequentially on the substrate. The terminal pad does not overlap with the first capacitor structure.

20 Claims, 13 Drawing Sheets

(52) U.S. Cl.
CPC .............. *H01L 2224/05562* (2013.01); *H01L 2224/05572* (2013.01); *H01L 2224/05573* (2013.01); *H01L 2224/05582* (2013.01); *H01L 2224/05583* (2013.01); *H01L 2224/05647* (2013.01); *H01L 2224/05655* (2013.01); *H01L 2224/13014* (2013.01); *H01L 2224/13022* (2013.01); *H01L 2224/13111* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/14131* (2013.01); *H01L 2224/94* (2013.01)

(56) References Cited

U.S. PATENT DOCUMENTS

| | | |
|---|---|---|
| 7,579,644 B2 | 8/2009 | Kim et al. |
| 7,785,977 B2 | 8/2010 | Nomura et al. |
| 8,866,260 B2 | 10/2014 | Shieh et al. |
| 2010/0129978 A1 | 5/2010 | Kim |
| 2014/0252547 A1 | 9/2014 | Chen et al. |
| 2015/0108607 A1* | 4/2015 | Chen .................. H01L 28/60 257/533 |

FOREIGN PATENT DOCUMENTS

| | | |
|---|---|---|
| KR | 20040022082 A | 3/2004 |
| KR | 20050019196 A | 3/2005 |
| KR | 100948575 B1 | 3/2010 |
| KR | 100958622 B1 | 5/2010 |
| KR | 20100073462 A | 7/2010 |
| KR | 20100079205 A | 7/2010 |
| KR | 101076792 B1 | 10/2011 |

* cited by examiner

【FIG. 1】
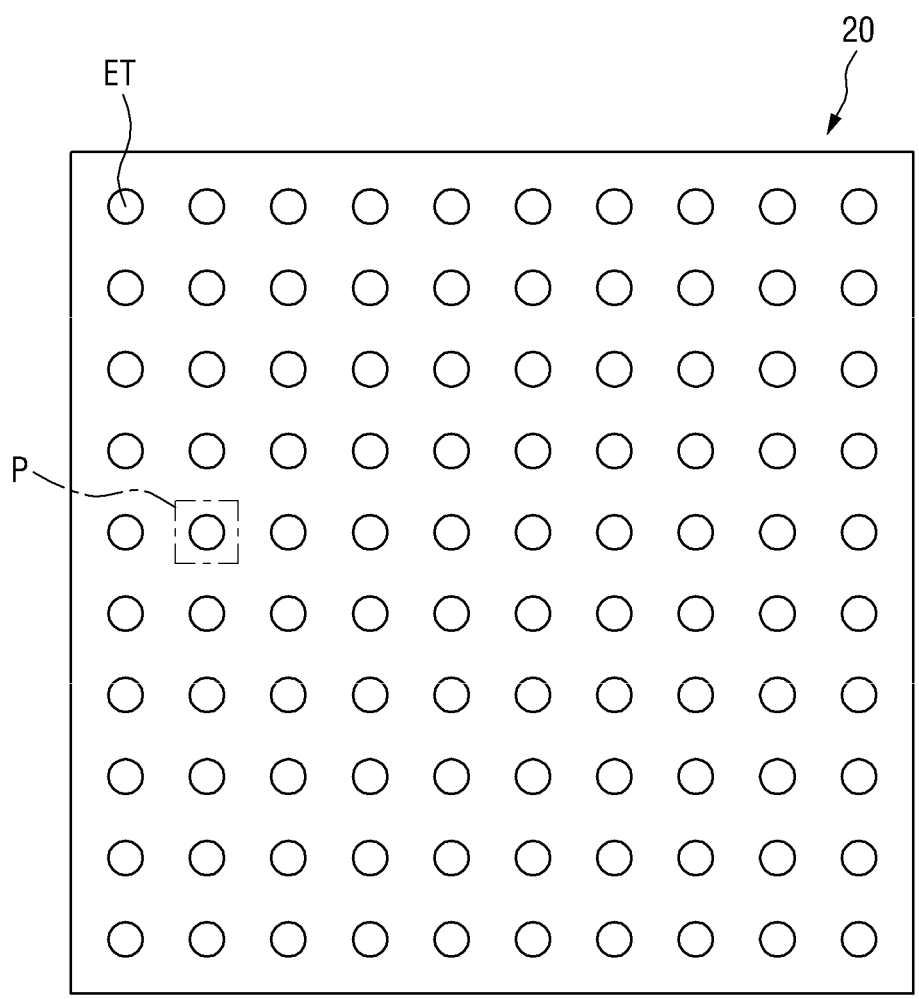

[FIG. 2]
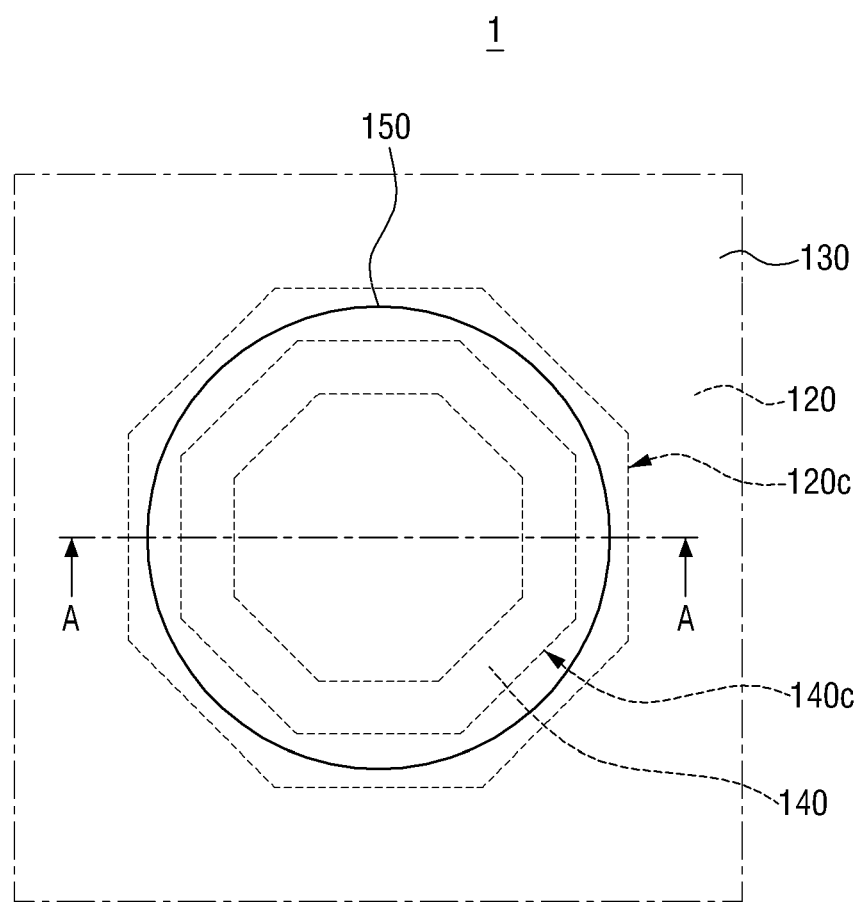

[FIG. 3]
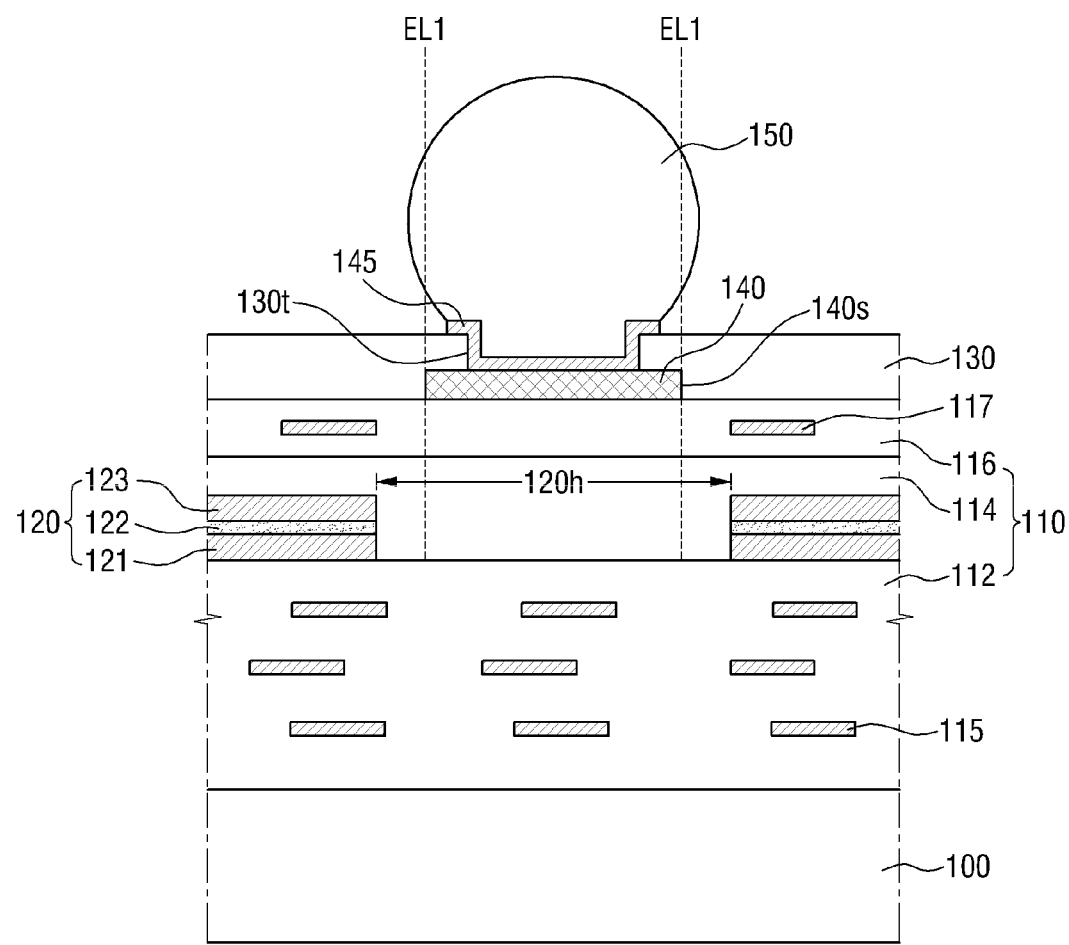

[FIG. 4]
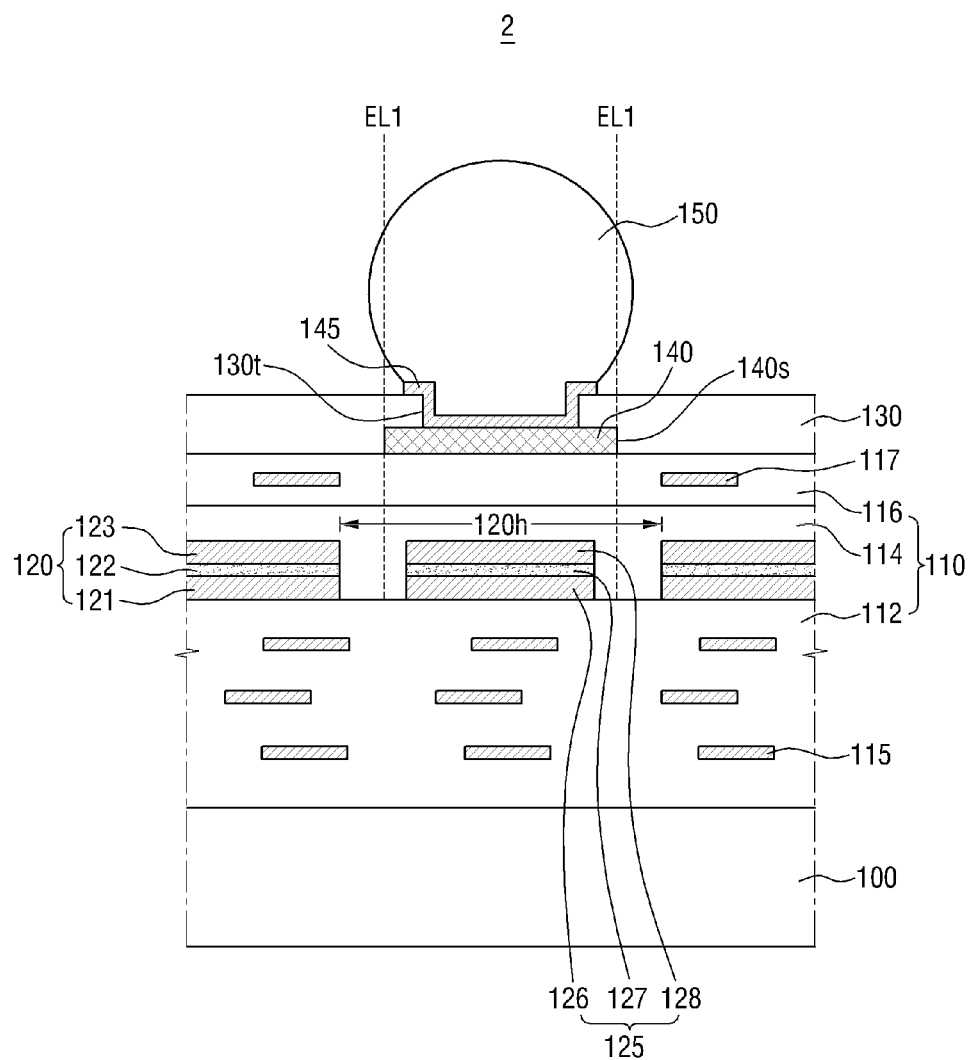

[FIG. 5]
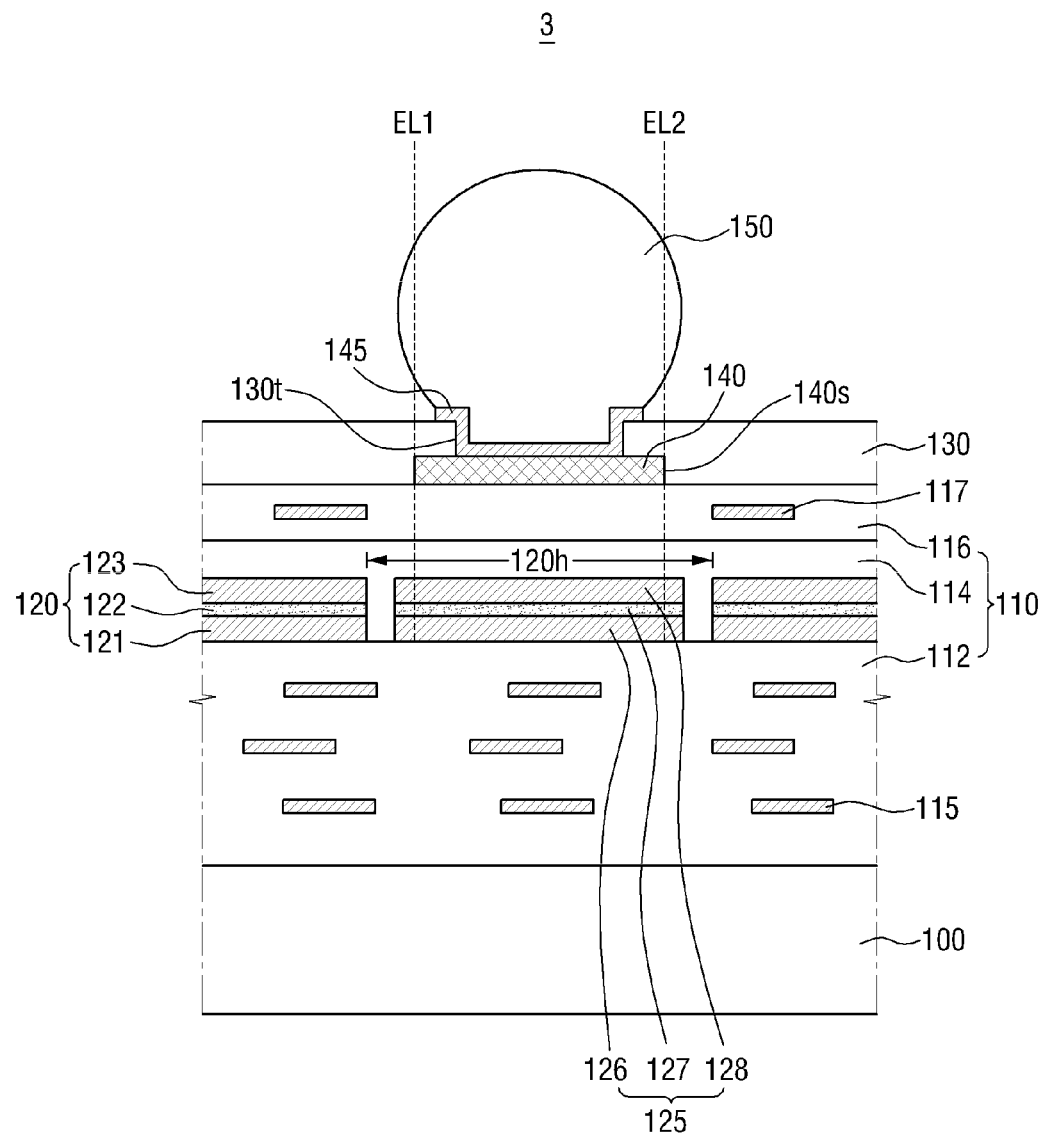

[FIG. 6]
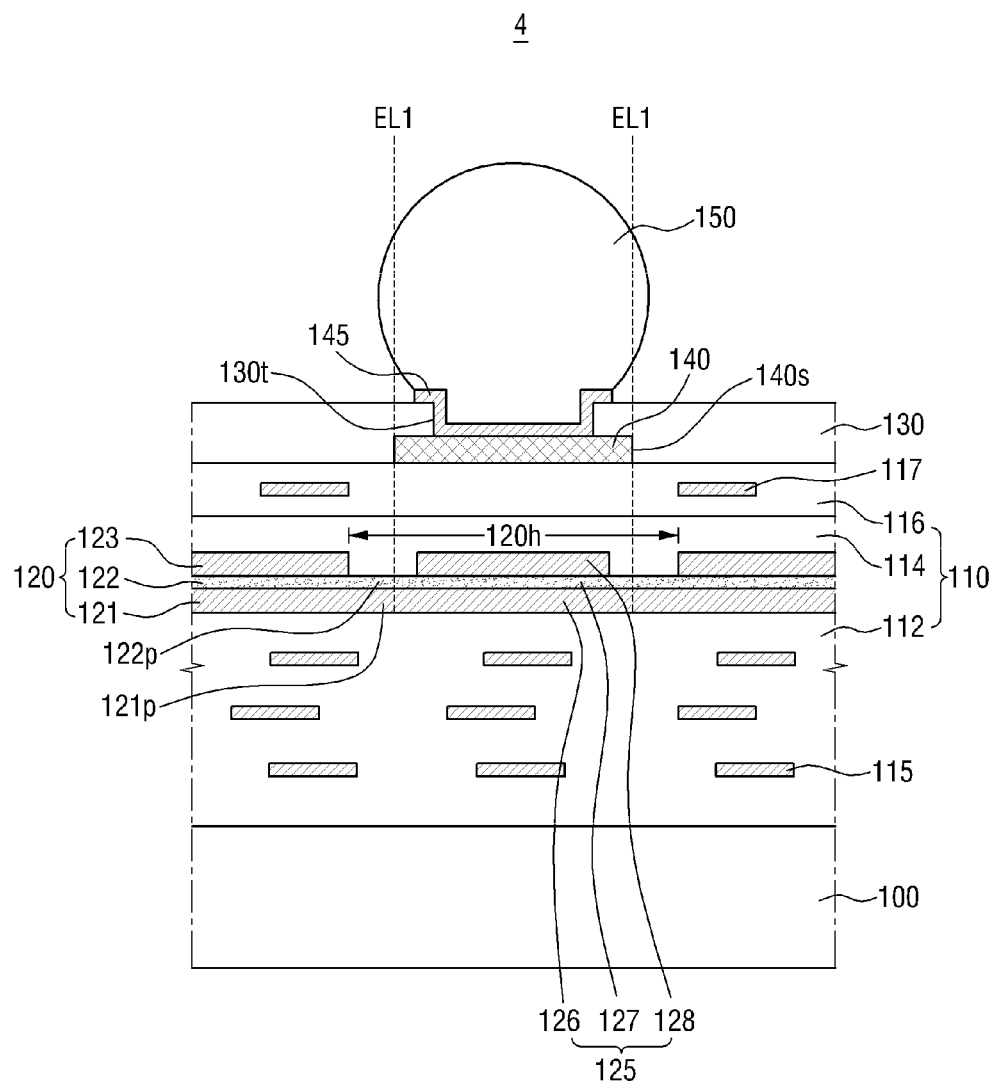

[FIG. 7]
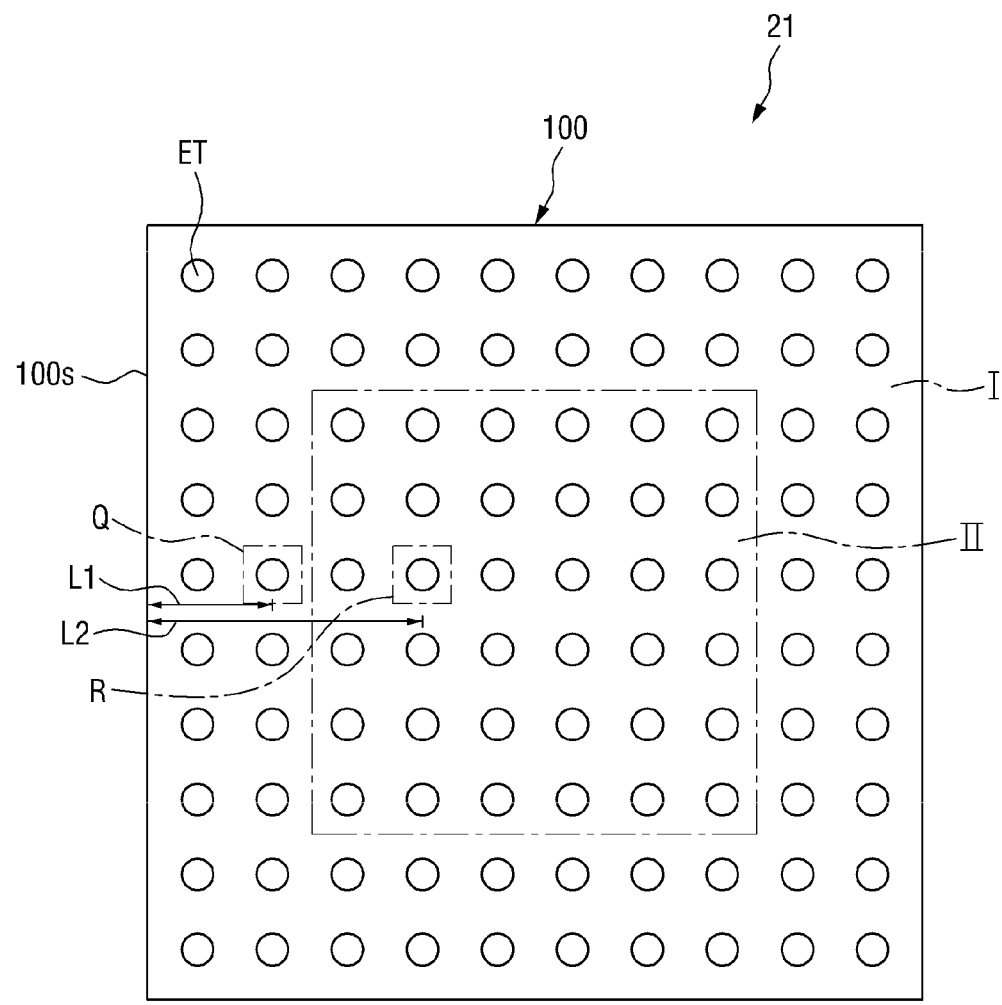

[FIG. 8]
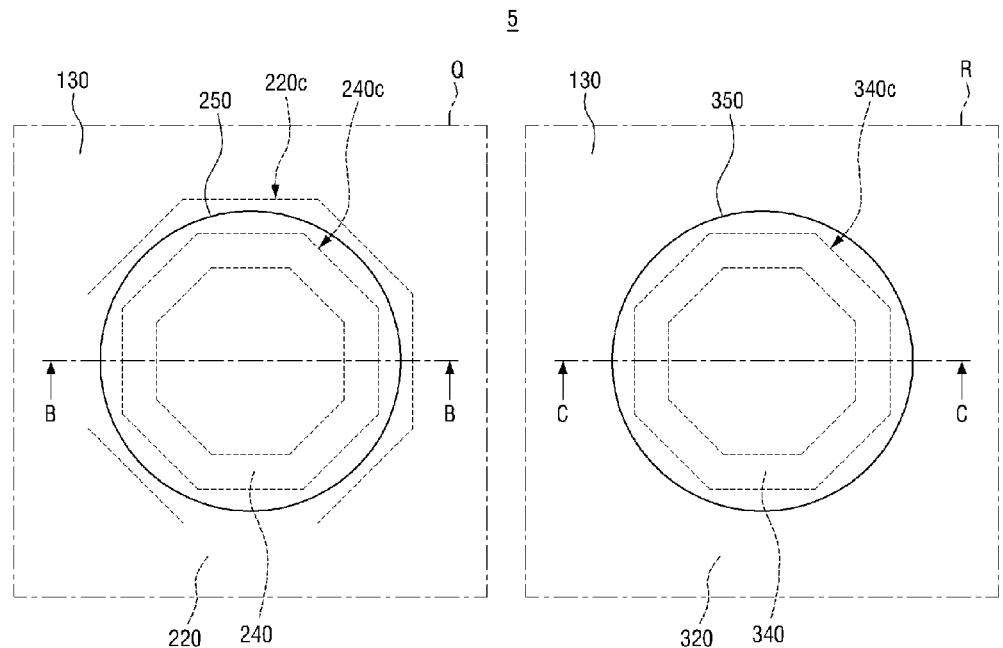
[FIG. 9]
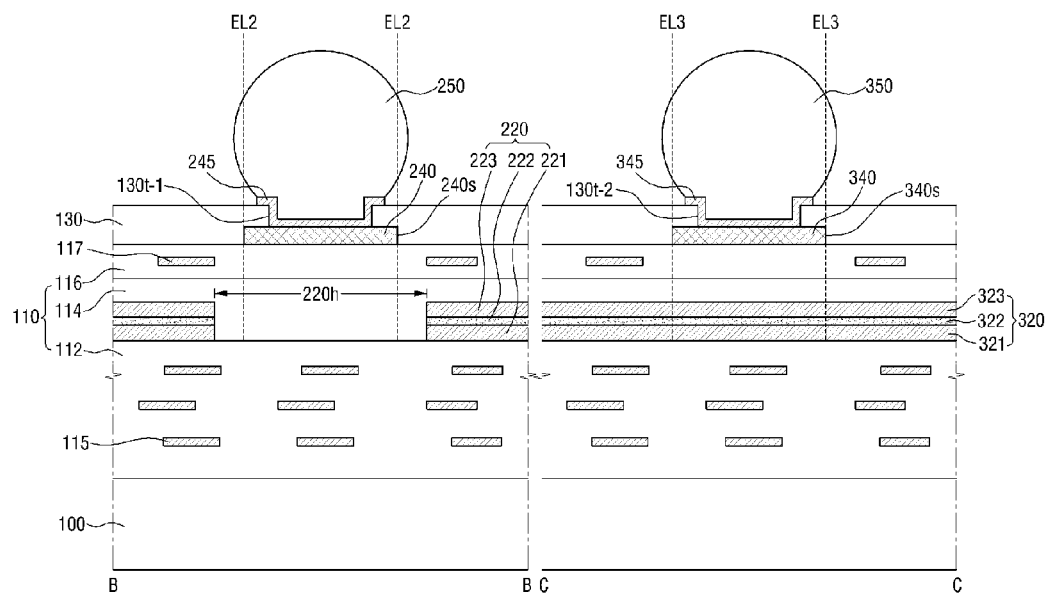

[FIG. 10]
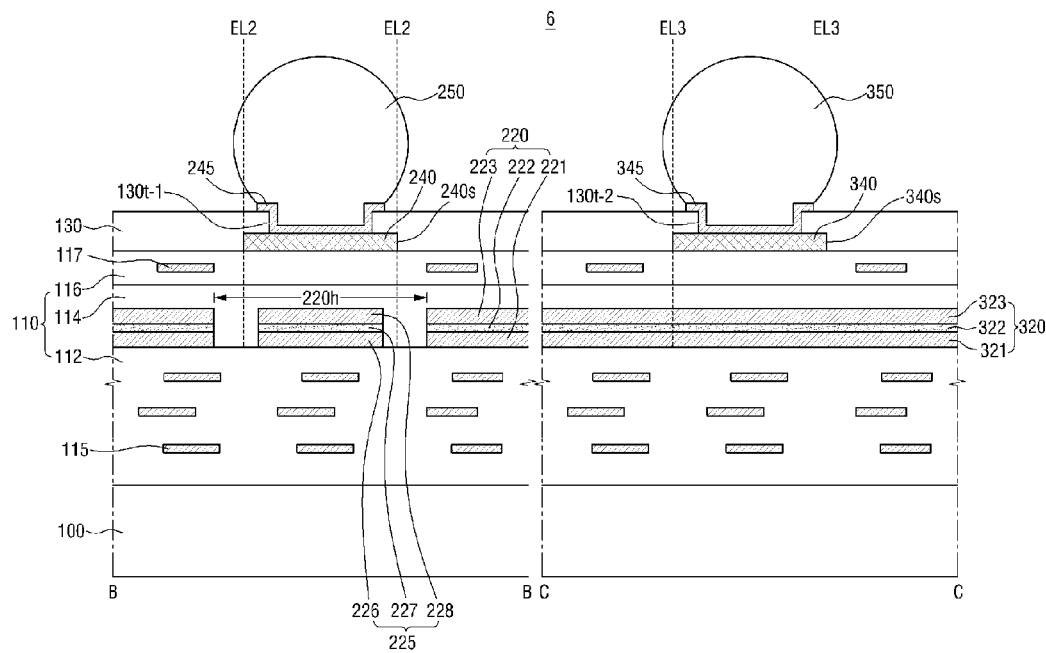
[FIG. 11]
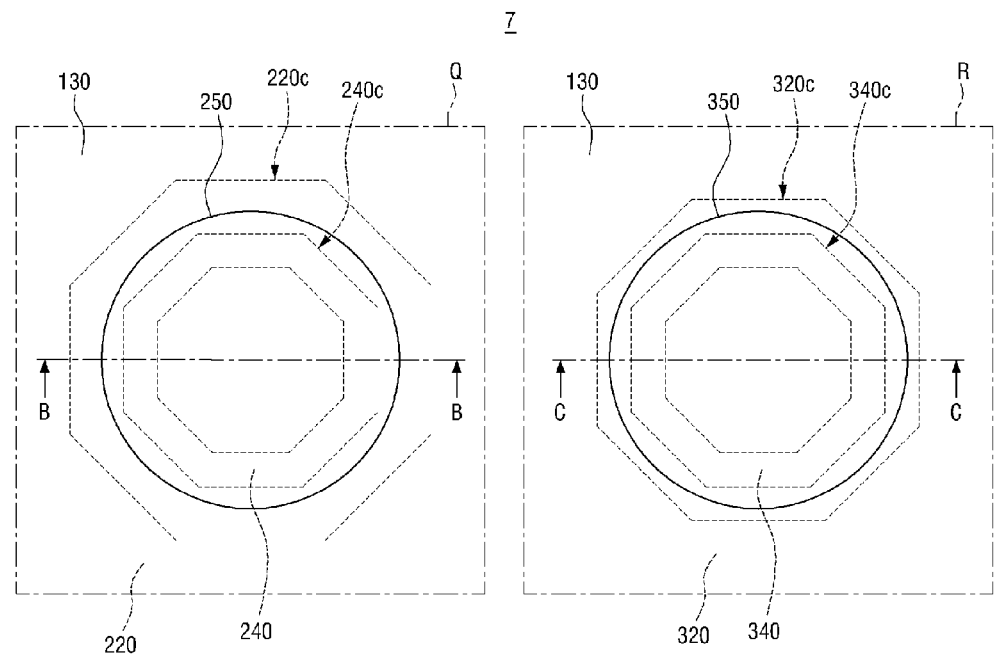

[FIG. 12]
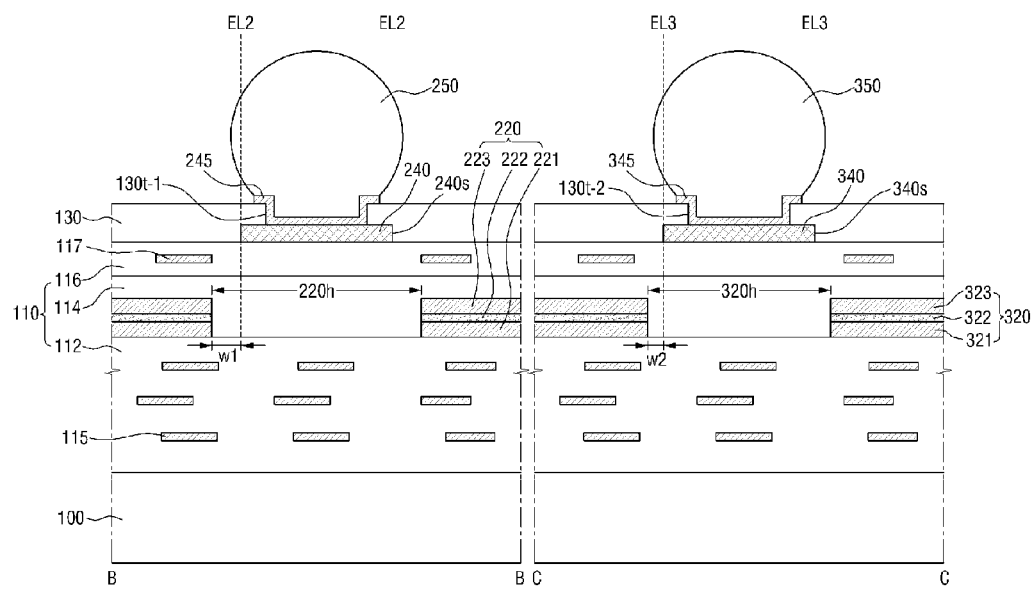

【FIG. 13】
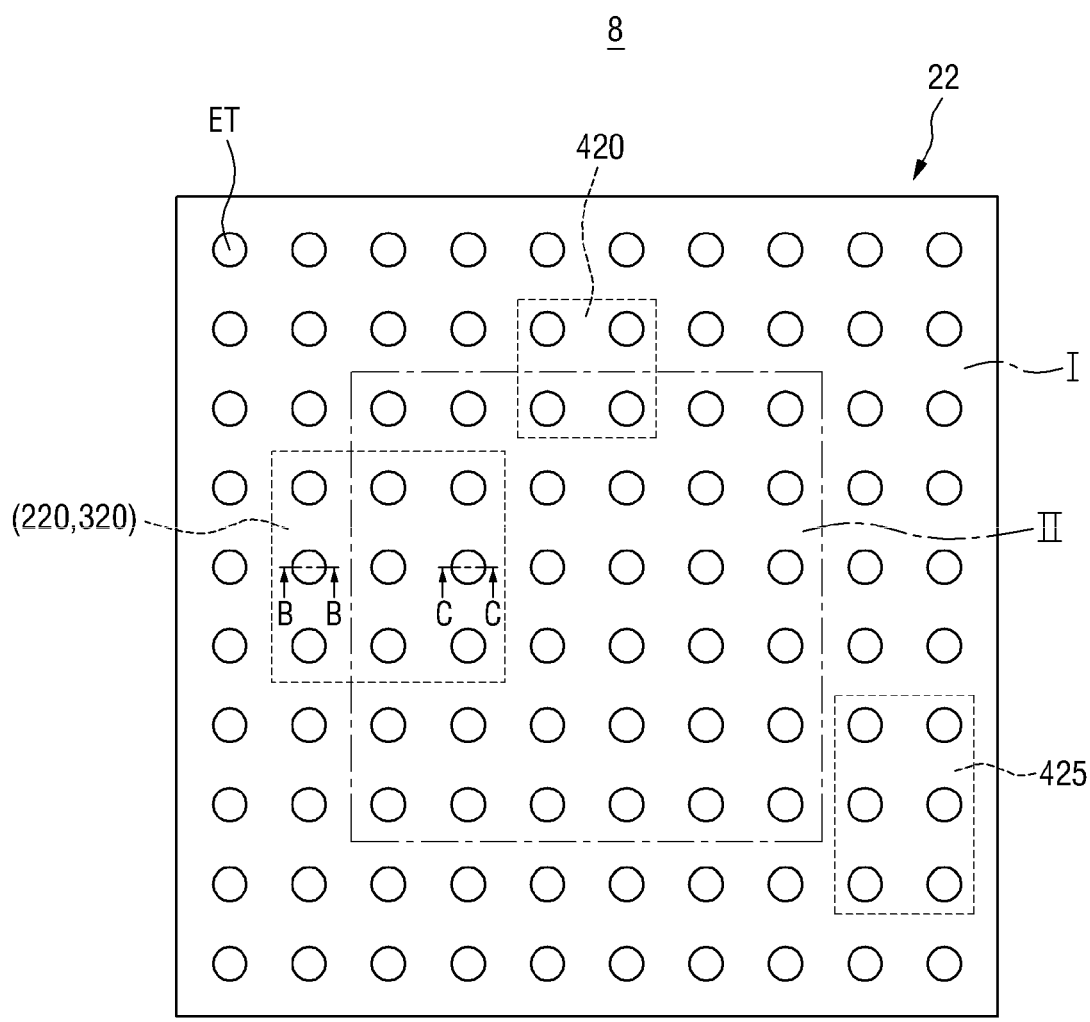

【FIG. 14】
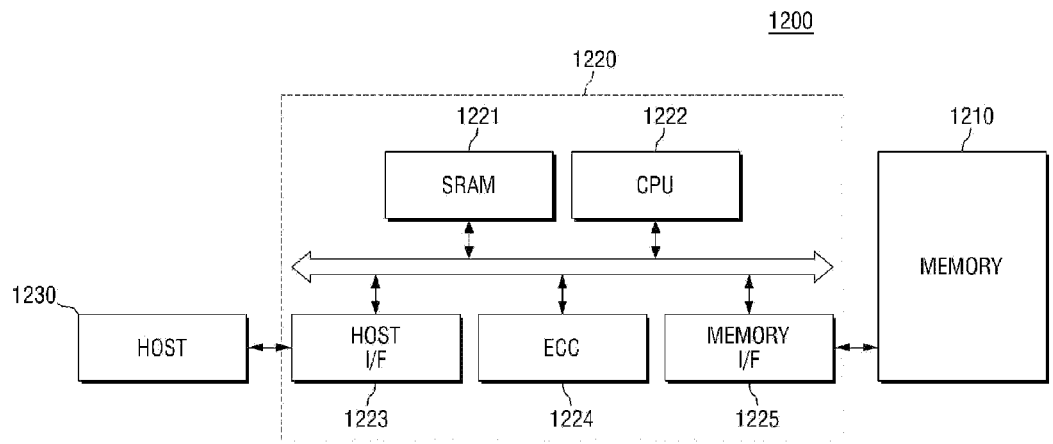
【FIG. 15】
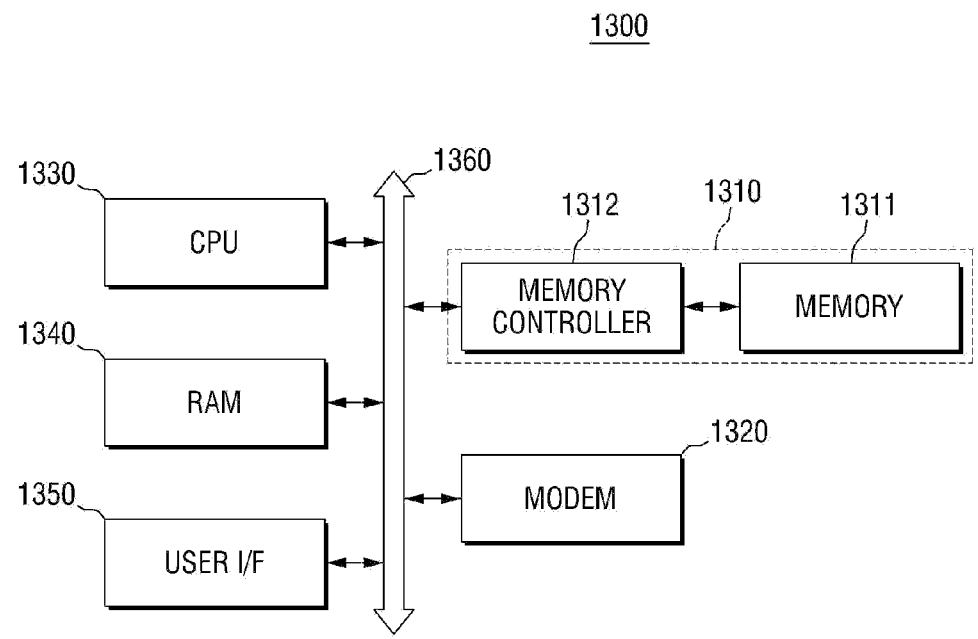

【FIG. 16】
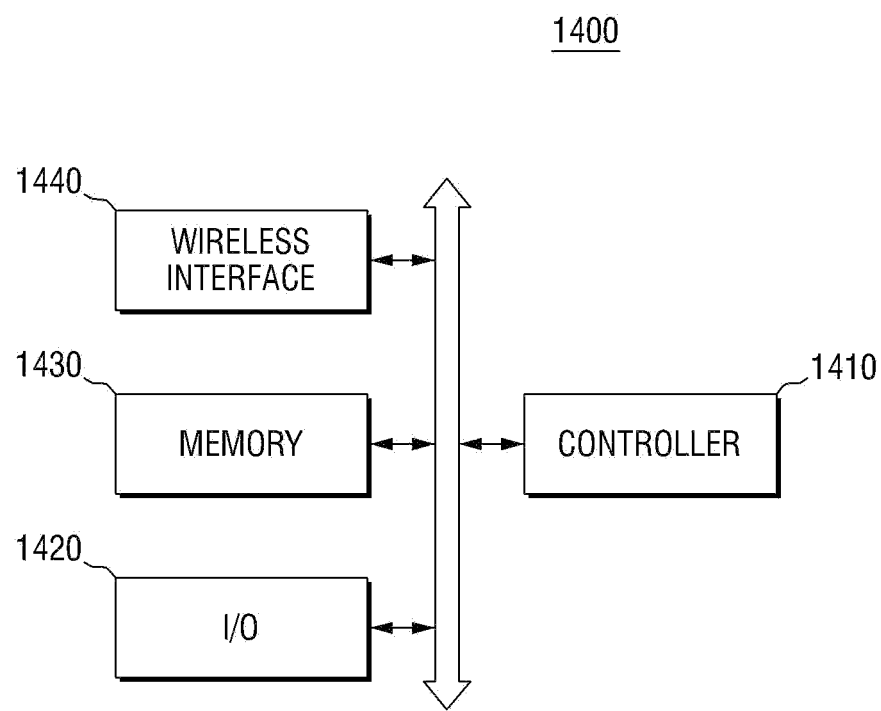

SEMICONDUCTOR DEVICES

CROSS-REFERENCE TO RELATED APPLICATION

This application claims priority under 35 U.S.C. § 119 from Korean Patent Application No. 10-2014-0154464 filed on Nov. 7, 2014 in the Korean Intellectual Property Office, and all the benefits accruing therefrom under 35 U.S.C. 119, the contents of which in its entirety are herein incorporated by reference.

TECHNICAL FIELD

Example embodiments of the present inventive concepts relate to semiconductor devices, and more particularly, to semiconductor devices including a metal-insulator-metal (MIM) capacitor disposed in a back end of line (BEOL).

BACKGROUND

A polysilicon-insulator-polysilicon (PIP) capacitor uses polysilicon as a capacitor electrode. The PIP capacitor has a limit in reducing resistance of the capacitor electrode due to characteristics of the polysilicon.

When a bias voltage is applied to the polysilicon capacitor electrode, a depletion region is generated and voltage is thus unstable, and as a result, a capacity of the capacitor is not constantly maintained.

Therefore, research into the MIM capacitor is actively progressed. The MIM capacitor has a structure in which a dielectric layer is arranged between upper and lower metallic electrodes.

SUMMARY

Example embodiments of the present inventive concepts relate to semiconductor devices, and more particularly, to semiconductor devices including a metal-insulator-metal (MIM) capacitor disposed in a back end of line (BEOL).

Example embodiments of the present inventive concepts have been made in an effort to provide a semiconductor device that can enhance reliability of an MIM capacitor by controlling a shape of a metal-insulator-metal (MIM) capacitor and a positional relationship between the MIM capacitor and a terminal pad.

Example embodiments of the present inventive concepts are not limited to the aforementioned technical objects. Other technical objects, which are not mentioned above, will be apparent to those skilled in the art from the following description.

According to example embodiments of the present inventive concepts, there is provided a semiconductor device including an interlayer insulating layer on a substrate, a first capacitor structure in the interlayer insulating layer, wherein the first capacitor structure includes at least one first laminate, the at least one first laminate including a first lower electrode, a first capacitor insulating layer, and a first upper electrode sequentially on the substrate, and a conductive layer including a terminal pad on the interlayer insulating layer, the terminal pad not overlapping with the first capacitor structure.

In some example embodiments of the present inventive concepts, a side wall of the terminal pad is separated from the first capacitor structure by a distance, and the distance is from a line extending downwards from the side wall to the first capacitor structure.

In some example embodiments of the present inventive concepts, the semiconductor device may further include a second capacitor structure in the interlayer insulating layer, wherein the second capacitor structure includes at least one second laminate, the at least one second laminate including a second lower electrode, a second capacitor insulating layer, and a second upper electrode sequentially on the substrate. At least a part of the second capacitor structure overlaps with the terminal pad, and the first upper electrode and the second upper electrode are separated from each other.

In some example embodiments of the present inventive concepts, a first height from the substrate to the first capacitor structure is the same as a second height from the substrate to the second capacitor structure.

In some example embodiments of the present inventive concepts, an entirety of the second capacitor structure overlaps with the terminal pad.

In some example embodiments of the present inventive concepts, the semiconductor device may further include a wire structure in the interlayer insulating layer. The first capacitor structure and the second capacitor structure are electrically connected with the wire structure.

In some example embodiments of the present inventive concepts, a length of the terminal pad is substantially equal to a length of the second capacitor structure, and the second capacitor structure overlaps with the terminal pad.

In some example embodiments of the present inventive concepts, the semiconductor device may further include a wire structure in the interlayer insulating layer. The first capacitor structure is electrically connected with the wire structure, and the second capacitor structure is electrically insulated from the wire structure.

In some example embodiments of the present inventive concepts, the first lower electrode and the second lower electrode are separated from each other, and the first capacitor insulating layer and the second capacitor insulating layer are separated from each other.

In some example embodiments of the present inventive concepts, the first lower electrode and the second lower electrode are connected to each other, and the first capacitor insulating layer and the second capacitor insulating layer are connected to each other.

In some example embodiments of the present inventive concepts, the semiconductor device may further include a second capacitor structure overlapping with the terminal pad, wherein the second capacitor structure is on the interlayer insulating layer.

In some example embodiments of the present inventive concepts, the semiconductor device may further include a passivation layer including an opening that exposes a part of the terminal pad, wherein the passivation layer is on the interlayer insulating layer.

In some example embodiments of the present inventive concepts, the semiconductor device may further comprise an external terminal connected with the terminal pad, and a conductive adhesive layer between the external terminal and the terminal pad.

According to example embodiments of the present inventive concepts, there is provided a semiconductor device including a first terminal pad on a surface of a substrate, a second terminal pad on the surface of the substrate, wherein the second terminal pad is further from edges of the substrate than the first terminal pad, a first capacitor structure under a periphery of the first terminal pad, wherein ends of the first capacitor structure are separated from ends of the first terminal pad in a horizontal direction, and a second capacitor structure under the second terminal pad.

In some example embodiments of the present inventive concepts, an entirety of the second terminal pad overlaps with the second capacitor structure.

In some example embodiments of the present inventive concepts, the first and second capacitor structures are excluded from an area between the first terminal pad and the substrate.

In some example embodiments, the second capacitor structure overlaps with the second terminal pad, and the second capacitor structure is between the second terminal pad and the substrate.

In some example embodiments of the present inventive concepts, the semiconductor device may further include a third capacitor structure between the first terminal pad and the substrate and separated from the first capacitor structure.

In some example embodiments of the present inventive concepts, a side wall of the first terminal pad is separated from the third capacitor structure by a distance, and the distance is from a line extending downwards from the side wall to the third capacitor structure.

In some example embodiments of the present inventive concepts, the second capacitor structure is below a periphery of the second terminal pad, and ends of the second capacitor structure are separated from the ends of the second terminal pad in the horizontal direction. A side wall of the first terminal pad is spaced apart from the first capacitor structure by a first distance, and the first distance is from a first line extending downwards from the side wall of the first terminal pad to the first capacitor structure. A side wall of the second terminal pad is spaced apart from the second capacitor structure by a second distance, and the second distance is from a second line extending downwards from the side wall of the second terminal pad to the second capacitor structure. The first distance is different than the second distance.

In some example embodiments of the present inventive concepts, the first distance is larger than the second distance.

In some example embodiments of the present inventive concepts, from a plan view perspective, the first and second capacitor structures are excluded from an area between the first terminal pad and the first capacitor structure.

In some example embodiments of the present inventive concepts, the first capacitor structure includes at least one first laminate, the at least one first laminate including a first lower electrode, a first capacitor insulating layer, and a first upper electrode sequentially on the substrate, and the second capacitor structure includes at least one second laminate, the at least one second laminate including a second lower electrode, a second capacitor insulating layer, and a second upper electrode sequentially on the substrate.

In some example embodiments of the present inventive concepts, the first lower electrode and the second lower electrode are directly connected to each other, the first capacitor insulating layer and the second capacitor insulating layer are directly connected to each other, and the first upper electrode and the second upper electrode are directly connected to each other.

In some example embodiments of the present inventive concepts, the semiconductor device may further include an interlayer insulating layer between the substrate and the first terminal pad, and between the substrate and the second terminal pad. The first capacitor structure and the second capacitor structure are in the interlayer insulating layer.

In some example embodiments of the present inventive concepts, the substrate includes a first region and a second region, the first region surrounds a periphery of the second region, and the first terminal pad is in the first region and the second terminal pad is in the second region.

In some example embodiments of the present inventive concepts, a distance from a side wall of the substrate to the first terminal pad is smaller than a distance from the side wall of the substrate to the second terminal pad from the side wall of the substrate.

According to example embodiments of the present inventive concepts, there is provided a semiconductor device including a first capacitor structure on a substrate and including a through-hole, the through-hole having a first circumference, a terminal pad including a second circumference on the first capacitor structure, the second circumference being delimited by the first circumference, and a passivation layer including an opening exposing a part of the terminal pad.

In some example embodiments, the semiconductor device further includes an external terminal connected with the terminal pad through the opening.

In some example embodiments of the present inventive concepts, from a plan view perspective, laminated structures, which include a lower electrode, a capacitor insulating layer, and an upper electrode sequentially on the substrate, are excluded from an area between the first circumference and the second circumference.

In some example embodiments of the present inventive concepts, the semiconductor device may further include a second capacitor structure in the through-hole and separated from the first capacitor structure.

In some example embodiments of the present inventive concepts, at least a part of the second capacitor structure is in the second circumference.

According to example embodiments, a semiconductor device includes an interlayer insulating layer on a substrate, a terminal pad on the interlayer insulating layer, and a first capacitor structure within the interlayer insulating layer and on a first region of the substrate, the first region being spaced apart from a periphery of the terminal pad in a horizontal direction.

Opposing ends of the terminal pad may extend in the horizontal direction such that nearest ends of the first capacitor structure are exposed.

The semiconductor device may further include a plurality of capacitor structures including the first capacitor structure. The plurality of capacitor structures may be over a different region of the substrate than the terminal pad.

The semiconductor may further include a second capacitor structure at least partially within the interlayer insulating layer and under the terminal pad. Edges of the second capacitor structure may be exposed, and the edges of the second capacitor structure may extend in the horizontal direction beyond edges of the terminal pad. A first edge of the second capacitor structure may be between a first edge of the terminal pad and a first edge of the first capacitor structure along the horizontal direction, and a second edge of the second capacitor structure may between a second edge of the terminal pad and a second edge of the first capacitor along the horizontal direction.

BRIEF DESCRIPTION OF THE DRAWINGS

Example embodiments will be more clearly understood from the following detailed description taken in conjunction with the accompanying drawings. FIGS. 1-16 represent non-limiting, example embodiments as described herein.

FIG. 1 is a schematic plan view of a semiconductor chip including a semiconductor device according to example embodiments of the present inventive concepts;

FIG. 2 is an enlarged diagram of part P of FIG. 1;

FIG. 3 is a cross-sectional view taken along line A-A of FIG. 2;

FIG. 4 is a diagram for describing a semiconductor device according to example embodiments of the present inventive concepts;

FIG. 5 is a diagram for describing a semiconductor device according to example embodiments of the present inventive concepts;

FIG. 6 is a diagram for describing a semiconductor device according to example embodiments of the present inventive concepts;

FIG. 7 is a schematic plan view of a semiconductor chip including the semiconductor device according to example embodiments of the present inventive concepts;

FIG. 8 is an enlarged diagram of parts Q and R of FIG. 7;

FIG. 9 is a cross-sectional view taken along lines B-B and C-C of FIG. 8;

FIG. 10 is a diagram for describing a semiconductor device according to example embodiments of the present inventive concepts;

FIG. 11 is a diagram for describing a semiconductor device according to example embodiments of the present inventive concepts;

FIG. 12 is a cross-sectional view taken along lines B-B and C-C of FIG. 11;

FIG. 13 is a schematic plan view of a semiconductor chip including the semiconductor device according to example embodiments of the present inventive concepts;

FIG. 14 is a block diagram of a memory card including the semiconductor devices according to the example embodiments of the present inventive concepts;

FIG. 15 is a block diagram of an information processing system using the semiconductor devices according to the example embodiments of the present inventive concepts; and FIG. 16 is a block diagram of an electronic apparatus including semiconductor devices according to the example embodiments of the present inventive concepts.

DETAILED DESCRIPTION OF EXAMPLE EMBODIMENTS

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments of the present inventive concepts relate to semiconductor devices, and more particularly, to semiconductor devices including a metal-insulator-metal (MIM) capacitor disposed in a back end of line (BEOL).

Hereinafter, a semiconductor device according to an embodiment of the present inventive concept will be described with reference to FIGS. 1 to 3.

FIG. 1 is a schematic plan view of a semiconductor chip including a semiconductor device according to example embodiments of the present inventive concepts. FIG. 2 is an enlarged diagram of part P of FIG. 1. FIG. 3 is a cross-sectional view taken along line A-A of FIG. 2.

First, referring to FIG. 1, a plurality of external terminals ET may be arranged on one surface of the semiconductor chip 20 including the semiconductor device according to example embodiments of the present inventive concepts.

The plurality of external terminals ET is arranged on one surface of the semiconductor chip 20 on the whole and regularly (e.g., in a pattern), but is just illustrated for easy description and is not limited thereto.

The plurality of external terminals ETs may have, for example, a ball shape or a pillar shape. The ball-shaped external terminal ET may include, for example, tin-silver (SnAg) alloy or tin (Sn), but is not limited thereto. The external terminal ET having the pillar shape may be a gold bump, or a coupled type of a lower bump including nickel (Ni), copper (Cu), palladium (Pd), platinum (Pt), gold (Au), or combinations thereof and an upper bump including tin-silver (SnAg) alloy or tin (Sn), but is not limited thereto.

A shape of a chip in which a wafer is separated into a plurality of pieces is illustrated in FIG. 1, but is not limited thereto. That is, FIG. 1 may illustrate a wafer unit before being separated into the plurality of chips.

The semiconductor chip 20 including the semiconductor device according to example embodiments of the present inventive concepts may be, for example, a memory chip, a logic chip, and the like. When the semiconductor chip 20 is the logic chip, the semiconductor chip 20 may be variously designed by considering a performed calculation, and the like. When the semiconductor chip 20 is the memory chip, the memory chip may be, for example, a non-volatile memory chip. In detail, the memory chip may be a flash memory chip. In more detail, the memory chip may be any one of a NAND flash memory chip or a NOR flash memory chip. However, a form of a memory device is not limited thereto.

In example embodiments of the present inventive concepts, the memory chip may include any one of a phase-change random-access memory (PRAM), a magneto-resistive random-access memory (MRAM), and a resistive random-access memory (RRAM).

The semiconductor chip 20 is not divided into (or classified as) the memory chip or the logic chip but may be a hybrid chip in which the memory chip and the logic chip are together implemented.

Referring to FIGS. 2 and 3, the semiconductor device 1 according to example embodiments of the present inventive concepts may include an interlayer insulating layer 110, a first capacitor structure 120, a first terminal pad 140, and the like.

In detail, the substrate 100 may be bulk silicon or a silicon-on-insulator (SOI). Unlike this, the substrate 100 may be a silicon substrate or may include another material, for example, silicon germanium, antimony indium, a lead tellurium compound, indium arsenic, indium phosphide, gallium arsenide, or antimony gallium, but is not limited thereto.

The interlayer insulating layer 110 may be formed on one surface of the substrate 100. The interlayer insulating layer 110 may include a lower interlayer insulating layer 112, a middle interlayer insulating layer 114, an upper interlayer insulating layer 116, and the like.

Each of the lower interlayer insulating layer 112, the middle interlayer insulating layer 114, and the upper interlayer insulating layer 116 may include, for example, at least one of silicon oxide, silicon nitride, silicon oxynitride, and a low-dielectric material.

The low dielectric material may include, for example, flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or combinations thereof, but is not limited thereto.

Although not illustrated in FIG. 3, circuit patterns used to perform a function of the semiconductor device, for example, a transistor, a diode, and the like may be formed between one surface of the substrate 100 and the interlayer insulating layer 110.

The lower interlayer insulating layer 112 may include a lower wire structure 115. The lower wire structure 115 may connect the circuit patterns to each other, electrically connect the circuit pattern and the external terminal, or be electrically connected with the first capacitor structure 120 to be described below.

The lower wire structure 115 may include, for example, at least one of copper (Cu), aluminum (Al), cobalt (Co), titanium (Ti), titanium nitride (TiN), tantalum (Ta), and tantalum nitride (TaN), but is not limited thereto.

The middle interlayer insulating layer 114 may be formed on the lower interlayer insulating layer 112. The first capacitor structure 120 may be formed in the middle interlayer insulating layer 114. Further, a conductive wire electrically connected with the first capacitor structure may be further formed in the middle interlayer insulating layer 114.

The upper interlayer insulating layer 116 may be formed on the middle interlayer insulating layer 114. The upper interlayer insulating layer 116 may include an upper wire structure 117. The upper wire structure 117 may be connected with the first terminal pad 140 and electrically connect the first terminal pad 140 and the lower wire structure 115 to each other.

The upper wire structure 117 may include, for example, at least one of copper (Cu), aluminum (Al), cobalt (Co), titanium (Ti), titanium nitride (TiN), tantalum (Ta), and tantalum nitride (TaN), but is not limited thereto.

The first capacitor structure 120 may be disposed in the interlayer insulating layer 110. In more detail, the first capacitor structure 120 may be disposed in the middle interlayer insulating layer 114. The first capacitor structure 120 may, for example, be electrically connected with the lower wire structure 115 and/or the upper wire structure 117.

The first capacitor structure 120 may include a first through-hole 120h. The first through-hole 120h may have a first circumference 120c. An upper portion of the first capacitor structure 120 and a lower portion of the first capacitor structure 120 may be connected to each other, by the first through-hole 120h.

In FIG. 2, it is illustrated that the first through-hole 120h has an octagonal shape, but just used for easy description and is not limited thereto.

The first capacitor structure 120 may include a first lower electrode 121, a first capacitor insulating layer 122, and a first upper electrode 123 sequentially laminated on the substrate 100.

The first lower electrode 121 may include a conductive material and may include, for example, at least one selected from conductive metal nitride (for example, titanium nitride, tantalum nitride, or tungsten nitride), metal (for example, ruthenium, iridium, titanium, or tantalum), and conductive metal oxide (for example, iridium oxide).

A first capacitor insulating layer 122 may include, for example, at least one of the silicon oxide, the silicon nitride, the silicon oxynitride, and a high dielectric constant material. The first capacitor insulating layer 122 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

The first upper electrode 123 may include, for example, at least one selected from conductive metal nitride (for example, titanium nitride, tantalum nitride, or tungsten nitride), metal (for example, ruthenium, iridium, titanium, or tantalum), and conductive metal oxide (for example, iridium oxide).

The first terminal pad 140 may be disposed on the interlayer insulating layer 110. That is, the first terminal pad 140 may be disposed on the first capacitor structure 120. The first terminal pad 140 may include metal such as aluminum (Al), or the like.

The circumference 140c of the first terminal pad 140 may be defined by being connected with a side wall 140s of the first terminal pad 140. On the plan view, the circumference 140c of the first terminal pad 140 may be positioned in the circumference 120c of the first through-hole 120h. That is, the circumference 140c of the first terminal pad 140 may be covered by the circumference 120c of the first through-hole 120h, but is not limited thereto.

In FIG. 2, it is illustrated that the first terminal pad 140 has a shape such as an island, but is just used for easy description and is not limited thereto. That is, a connection wire connected with the first terminal pad 140 may extend in one direction from the circumference 140c of the first terminal pad 140. As a result, the first terminal pad 140 and the metal wire including a connection wire that extends from the first terminal pad 140 may be disposed on the interlayer insulating layer 110.

In FIG. 2, it is illustrated that the circumference 140c of the first terminal pad 140 has the octagonal shape, but is just used for easy description and is not limited thereto.

The first terminal pad 140 may be a bonding pad electrically connected with the circuit pattern formed on one surface of a first external terminal 150 and one surface of the first substrate 100, but is not limited thereto.

The circumference 140c of the first terminal pad 140 may be positioned in the circumference 120c of the first through-hole 120h. Therefore, the first terminal pad 140 may not overlap with the first capacitor structure 120.

In other words, the circumference 140c of the first terminal pad 140 may be defined by being connected with the side wall 140s of the first terminal pad. Because the circumference 140c of the first terminal pad 140 is positioned in the circumference 120c of the first through-hole 120h, an extension line EL1 of the side wall 140s of the first terminal pad may not meet the first capacitor structure 120. Accordingly, the extension line EL2 of the side wall 140s of the first terminal pad may be separated from the first capacitor structure 120.

In the semiconductor device 1 according to example embodiments of the present inventive concepts, a capacitor structure in which a lower electrode, a capacitor insulating layer, and an upper electrode are sequentially laminated may not be disposed between the circumference 140c of the first terminal pad 140 and the circumference 120c of the first through-hole 120h, in the middle interlayer insulating layer 114.

In the semiconductor device 1 according to example embodiments of the present inventive concepts, no capacitor structure that overlaps with the first terminal pad 140 may be disposed in the interlayer insulating layer 110.

A passivation layer 130 may be disposed on the interlayer insulating layer 110 and the first terminal pad 140. The passivation layer 130 may include a first opening 130t that exposes a part of the first terminal pad 140.

The passivation layer 130 may include, for example, at least one of polyimide (PI), photosensitive polyimide (PSPI), photoresist (PR), polystyrene, benzocyclobutene (BCB), silicon nitride, silicon oxide, silicon oxynitride, silicon carbon nitride, silicon carbon oxynitride, and tetra ethyl ortho silicate (TEOS), but is not limited thereto.

A first conductive adhesive layer 145 may be formed on the passivation layer 130 and the first terminal pad 140. The first conductive adhesive layer 145 may be formed to contact the first terminal pad 140. The first conductive adhesive layer 145 may be interposed between the first external terminal 150 and the first terminal pad 140. The first conductive adhesive layer 145 may be conformally formed along the passivation layer 130 and the first opening 130t.

The first conductive adhesive layer 145 may be so called under bump metallurgy (UBM) that serves as an adhesive layer, a diffusion preventing layer and/or a wetting layer. In detail, when the first eternal terminal 150 is directly formed on the exposed first terminal pad 140, stress may concentrate between the first terminal pad 140 and the first external terminal 150 which are made of different materials. As a result, a phenomenon in which the first external terminal 150 does not adhere onto the first terminal pad 140 may occur. That is, because a solder material or a bump material is not wet to the first terminal pad 140, the first terminal pad 140 and the first external terminal 150 may not adhere to each other.

Although the first terminal pad 140 and the first external terminal 150 adhere to each other, the stress may concentrate on an adhesive surface of the first terminal pad 140 and the first external terminal 150. When the stress concentrates on the adhesive surface, the adhesive surface of the first terminal pad 140 and the first external terminal 150 may be separate while the semiconductor device continuously operates and mechanical failure easily occurs.

In the first conductive adhesive layer 145, various metals including, for example, chrome (Cr), copper (Cu), nickel (Ni), titanium-tungsten (TiW), nickel-vanadium (NiV), and the like may be formed in a multilayer structure. As one example, the first conductive adhesive layer 145 may be formed in a structure of Ti/Cu, Cr/Cr-Cu/Cu, TiW/Cu, Al/NiV/Cu, or Ti/Cu/Ni, but is not limited thereto.

The first external terminal 150 on the first conductive adhesive layer 145 is just illustrated in FIGS. 2 and 3 for easy description. Accordingly, the first external terminal 150 may not be included in the semiconductor device 1 according to example embodiments of the present inventive concepts.

In FIG. 3, it is illustrated that the first external terminal 150 is a terminal that has the ball shape, but is not limited thereto. That is, the first external terminal 150 may be a bump that has the pillar shape.

The first external terminal 150 may be connected with the first terminal pad 140 through the first opening 130t.

Hereinafter, one of effects which may be acquired through the semiconductor device according to example embodiments of the present inventive concepts will be described.

When power or an electric signal is repeatedly input into or output from an external device through the first external terminal 150, Joule heat is generated from the first external terminal 150, and the like.

The generated Joule heat may be radiated to the outside, but thermo mechanical stress is subjected to the capacitor structure due to the generated Joule heat. That is, because the capacitor structure has a metallic electrode having large Young's Modulus, the thermo mechanical stress is subjected to the capacitor structure.

The thermo mechanical stress has a maximum value at edges of the first terminal pad 140 due to the generated Joule heat. That is, in the capacitor structure that meets the extension line EL1 of the side wall 140s of the first terminal pad, the thermo mechanical stress is applied to the capacitor structure with the maximum value.

Accordingly, a defect, or the like easily occurs due to the thermo mechanical stress at a portion of the capacitor structure, where the thermo mechanical stress is applied with the maximum value. For example, the capacitor insulating layer of the capacitor structure may be broken or respective layers included in the capacitor structure may be split, due to the thermo mechanical stress. That is, a reliability problem of the semiconductor device may occur.

Accordingly, the capacitor structure is not positioned at the portion of the capacitor structure, where the thermo mechanical stress is applied with the maximum value to prevent the defect from occurring due to the thermo mechanical stress.

Referring to FIG. 4, a semiconductor device according to example embodiments of the present inventive concepts will be described. For easy description, a difference from the description with reference to FIGS. 2 and 3 will be primarily described.

FIG. 4 is a diagram for describing the semiconductor device according to example embodiments of the present inventive concepts.

Referring to FIG. 4, the semiconductor device 2 according to example embodiments of the present inventive concepts may further include a second capacitor structure 125.

The second capacitor structure 125 may be disposed in the middle interlayer insulating layer 114, in the interlayer insulating layer 110 in more detail. The second capacitor structure 125 may be disposed on (or contact) the same level as the first capacitor structure 120 and one surface of the substrate 100. That is, a height to an upper surface of the first capacitor structure 120 from one surface of the substrate 100 may be substantially the same as a height to an upper surface of the second capacitor structure 125 from the one surface of the substrate 100.

At least a part of the second capacitor structure 125 may overlap with the first terminal pad 140.

In the semiconductor device 2 according to example embodiments of the present inventive concepts, the entirety of the second capacitor structure 125 may overlap with the first terminal pad 140. In other words, from the plan view perspective, the second capacitor structure 125 may be disposed in the circumference 140c of the first terminal pad 140.

The extension line EL1 of the side wall 140s of the first terminal pad may not meet (or extend to) the second capacitor structure 125. Accordingly, the extension line EL1 of the side wall 140s of the first terminal pad may be separated from the second capacitor structure 125.

The second capacitor structure 125 may be disposed in the first through-hole 120h. That is, the second capacitor structure 125 may be disposed in the circumference 120c of the first through-hole 120h.

In the semiconductor device 2 according to example embodiments of the present inventive concepts, the second capacitor structure 125 may, for example, be electrically connected with the lower wire structure 115 and/or the upper wire structure 117. That is, the first capacitor structure 120 and the second capacitor structure 125 may, for example, be electrically connected with the lower wire structure 115 and/or the upper wire structure 117, respectively.

The second capacitor structure 125 may include a second lower electrode 126, a second capacitor insulating layer 127, and a second upper electrode 128 sequentially laminated on the substrate 100.

The second lower electrode 126 may include the conductive material and may include, for example, at least one selected from conductive metal nitride (for example, titanium nitride, tantalum nitride, or tungsten nitride), metal (for example, ruthenium, iridium, titanium, or tantalum), and conductive metal oxide (for example, iridium oxide).

The second capacitor insulating layer 127 may include, for example, at least one of the silicon oxide, the silicon nitride, the silicon oxynitride, and a high dielectric constant material. The second capacitor insulating layer 127 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

The second upper electrode 128 may include, for example, at least one selected from conductive metal nitride (for example, titanium nitride, tantalum nitride, or tungsten nitride), metal (for example, ruthenium, iridium, titanium, or tantalum), and conductive metal oxide (for example, iridium oxide).

Because the first capacitor structure 120 and the second capacitor structure 125 may be formed in the same fabrication process, the first lower electrode 121 and the second lower electrode 126 may include the same material, the first capacitor insulating layer 122 may include the same material as the second capacitor insulating layer 127, and the first upper electrode 123 may include the same material as the second upper electrode 128.

In the semiconductor device 2 according to example embodiments of the present inventive concepts, the second capacitor structure 125 may be separated from the first terminal pad 120. That is, the first lower electrode 121 may be separated from the second lower electrode 126, the first upper electrode 123 may be separated from the second upper electrode 128, and the first capacitor insulating layer 122 may be separated from the second capacitor insulating layer 127.

Therefore, in the middle interlayer insulating layer 114, the capacitor structure in which the lower electrode, the capacitor insulating layer, and the upper electrode are sequentially laminated may not be disposed between the first capacitor structure 120 and the second capacitor structure 125.

Referring to FIG. 5, a semiconductor device according to example embodiments of the present inventive concepts will be described. For easy description, a difference from the description with reference to FIG. 5 will be primarily described.

FIG. 5 is a diagram for describing a semiconductor device according to example embodiments of the present inventive concepts.

Referring to FIG. 5, in the semiconductor device 3 according to example embodiments of the present inventive concepts, a part of the second capacitor structure 125 may overlap with the first terminal pad 140 and a remaining part of the second capacitor structure 125 may not overlap with the first terminal pad 140.

From the plan view perspective, the circumference 140c of the first terminal pad 140 may be positioned in the second capacitor structure 125. That is, a part of the second capacitor structure 125 may be disposed in the circumference 140c of the first terminal pad 140 and the remaining part of the second capacitor structure 125 may be disposed outside the circumference 140c of the first terminal pad 140. Accordingly, the extension line EL1 of the side wall 140s of the first terminal pad may meet (or extend to) the second capacitor structure 125.

However, the second capacitor structure 125 may be disposed in the first through-hole 120h. That is, in the semiconductor device 3 according to example embodiments of the present inventive concepts, the second capacitor structure 125 may be disposed in the circumference 120c of the first through-hole 120h.

In the semiconductor device 3 according to example embodiments of the present inventive concepts, the second capacitor structure 125 may, for example, not be electrically connected with the lower wire structure 115 and/or the upper wire structure 117. The second capacitor structure 125 may, for example, be electrically insulated from the lower wire structure 115 and/or the upper wire structure 117. That is, the second capacitor structure 125 may be a dummy capacitor that does not operate as a capacitor in a circuit.

In other words, the first capacitor structure 120 may be electrically connected with the lower wire structure 115 and/or the upper wire structure 117, but the second capacitor structure 125 may not be electrically connected with the lower wire structure 115 and/or the upper wire structure 117.

Referring to FIG. 6, a semiconductor device according to example embodiments of the present inventive concepts will be described. For easy description, a difference from the description with reference to FIG. 4 will be primarily described.

FIG. 6 is a diagram for describing a semiconductor device according to example embodiments of the present inventive concepts.

Referring to FIG. 6, in the semiconductor device 4 according to example embodiments of the present inventive concepts, the first capacitor structure 120 and the second capacitor structure 125 may not be separated from each other.

In more detail, the first upper electrode 123 of the first capacitor structure 120 and the second upper electrode 128 of the second capacitor structure 125 may be separated from each other.

However, the first capacitor insulating layer 122 and the second capacitor insulating layer 127 may be connected by a connection insulating layer 122p, and the first lower electrode 121 and the second lower electrode 126 may be connected by a connection conductor 121p.

Accordingly, the first capacitor structure 120 and the second capacitor structure 125 may be connected to each other by the connection insulating layer 122p and the connection conductor 121p.

The connection insulating layer 122p may, for example, not be electrically connected with the upper lower wire 115 and/or the upper wire structure 117.

The connection insulating layer 122p may include the same material as the first capacitor insulating layer 122 and the second capacitor insulating layer 127, and the connection conductor 121p may include the same material as the first lower electrode 121 and the second lower electrode 126.

As described in the part regarding the FIGS. 2 and 3, the thermo mechanical stress has the maximum value at the edges of the first terminal pad 140. That is, if the capacitor structure meets (or extends to) the extension line EL1 of the side wall 140s of the first terminal pad, the maximum value of the thermo mechanical stress is applied to the capacitor structure.

Therefore, because the connection conductor 121p and the connection insulating layer 122p are positioned at a portion where the thermo mechanical stress has the maximum value, the thermo mechanical stress may be generated by the connection conductor 121p and the connection insulating layer 122p.

However, when the thickness of the metallic material is reduced, the thermo mechanical stress may be reduced. That is, thermo mechanical stress when the connection conductor 121p exists at the edges of the first terminal pad 140 is lower than thermo mechanical stress when both an upper electrode and a lower electrode exist at the edges of the first terminal pad 140.

As a result, the thermo mechanical stress is reduced at the edges of the first terminal pad 140 to reduce the defect which occurs due to the thermo mechanical stress.

Referring to FIGS. 7 to 9, a semiconductor device according to example embodiments of the present inventive concepts will be described.

FIG. 7 is a schematic plan view of a semiconductor chip including the semiconductor device according to example embodiments of the present inventive concepts. FIG. 8 is an enlarged diagram of parts Q and R of FIG. 7. FIG. 9 is a cross-sectional view taken along lines B-B and C-C of FIG. 8.

Referring to FIG. 7, a plurality of external terminals ET may be arranged on one surface of the semiconductor chip 21 including the semiconductor device according to example embodiments of the present inventive concepts. That is, the plurality of external terminals ET may be arranged on one surface of the substrate 100.

The substrate 100 may include a first region I and a second region II. The first region I may be an outer portion of the substrate 100 and the second region II may be a center portion of the substrate 100. That is, the first region I may surround the periphery of the second region II.

The substrate 100 is just arbitrarily divided into the first region I and the second region II and is not limited thereto. In FIG. 7, when parts Q and R are defined, the first region I of the substrate 100 includes a region closer to the side wall 100s of the substrate 100, and the second region II of the substrate 100 includes a region more distant from the side wall 100s of the substrate 100.

Referring to FIGS. 7 to 9, the semiconductor device 5 according to example embodiments of the present inventive concepts may include a third capacitor structure 220, a fourth capacitor structure 320, a second terminal pad 240, a third terminal pad 340, and the like.

The third capacitor structure 220 and the second terminal pad 240 may be disposed in the first region I of the substrate 100, and the fourth capacitor structure 320 and the third terminal pad 340 may be disposed in the second region II of the substrate 100.

The third capacitor structure 220 and the fourth capacitor structure 320 may be disposed in the interlayer insulating layer 110. In more detail, the third capacitor structure 220 and the fourth capacitor structure 320 may be disposed in the interlayer insulating layer 114. The third capacitor structure 220 and the fourth capacitor structure 320 may, for example, be electrically connected with the lower wire structure 115 and/or the upper wire structure 117, respectively.

The third capacitor structure 220 may include a second through-hole 220h. The second through-hole 220h may have a second circumference 220c. An upper portion of the third capacitor structure 220 and a lower portion of the third capacitor structure 220 may be connected to each other, by the second through-hole 220h.

However, the fourth capacitor structure 320 may not include a through-hole on the periphery of the third terminal pad 340. A description thereof is made in association with the third terminal pad 340.

The third capacitor structure 220 may be disposed on the same level as the fourth capacitor structure 320 and one surface of the substrate 100. That is, a height to an upper surface of the third capacitor structure 220 from one surface of the substrate 100 may be substantially the same as a height to an upper surface of the fourth capacitor structure 320 from the one surface of the substrate 100.

The third capacitor structure 220 may include a third lower electrode 221, a third capacitor insulating layer 222, and a third upper electrode 223 sequentially laminated on the substrate 100 and the fourth capacitor structure 320 may include a fourth lower electrode 321, a fourth capacitor insulating layer 322, and a fourth upper electrode 323 sequentially laminated on the substrate 100.

In the semiconductor device 5 according to example embodiments of the present inventive concepts, the third capacitor structure 220 and the fourth capacitor structure 320 may be separated from each other. That is, the third capacitor structure 220 and the fourth capacitor structure 320 may be capacitors having capacitances, respectively.

For example, the third upper electrode 223 and the fourth upper electrode 323 may be separated from each other, and the third capacitor insulating layer 222 and the fourth capacitor insulating layer 322 may be separated from each other.

Each of the third upper electrode 223 and the fourth upper electrode 323 may include, for example, at least one selected from conductive metal nitride (for example, titanium nitride, tantalum nitride, or tungsten nitride), metal (for example, ruthenium, iridium, titanium, or tantalum), and conductive metal oxide (for example, iridium oxide).

Each of the third capacitor insulating layer 222 and the fourth capacitor insulating layer 322 may include, for example, at least one of the silicon oxide, the silicon nitride, the silicon oxynitride, and a high dielectric constant material.

Each of the third lower electrode 221 and the fourth lower electrode 321 may include, for example, at least one selected from conductive metal nitride (for example, titanium nitride, tantalum nitride, or tungsten nitride), metal (for example, ruthenium, iridium, titanium, or tantalum), and conductive metal oxide (for example, iridium oxide).

Because the third capacitor structure 220 and the fourth capacitor structure 320 may be formed in the same fabrication process, the third lower electrode 221 and the fourth lower electrode 321 may include the same material as the fourth lower electrode 321, the third capacitor insulating layer 222 may include the same material as the fourth capacitor insulating layer 322, and the third upper electrode 223 may include the same material as the fourth upper electrode 323.

Each of the second terminal pad 240 and the third terminal pad 340 may be disposed on the interlayer insulating layer 110. The second terminal pad 240 may be disposed on the third capacitor structure 220 and the third terminal pad 340 may be disposed on the fourth capacitor structure 320.

Each of the second terminal pad 240 and the third terminal pad 340 may be disposed on the same axis of the substrate 100. That is, both the second terminal pad 240 and the third terminal pad 340 may be disposed on one surface of the substrate 100.

The third terminal pad 340 is further distant from the edges of the substrate 100 than the second terminal pad 240. In detail, a first distance L1 up to the second terminal pad 240 from the side wall 100s of the substrate is smaller than a second distance L2 up to the third terminal pad 340 from the side wall 100s of the substrate.

A circumference 240c of the second terminal pad 240 may be defined by being connected with a side wall 240s of the second terminal pad 240. From the plan view perspective, the circumference 240c of the second terminal pad 240 may be positioned in the circumference 220c of the second through-hole 220h.

Therefore, the third capacitor structure 220 may be disposed below the periphery of the second terminal pad 240 and may not overlap with the second terminal pad 240.

Because the circumference 240c of the second terminal pad 240 is positioned in the circumference 220c of the second through-hole 220h, an extension line EL2 of the side wall 240s of the second terminal pad may not meet (or extend to) the third capacitor structure 220, but may be separated from the third capacitor structure 220.

In the semiconductor device 5 according to example embodiments of the present inventive concepts, no capacitor structure in which the lower electrode, the capacitor insulating layer, and the upper electrode are sequentially laminated may be disposed between the circumference 240c of the second terminal pad 240 and the circumference 220c of the second through-hole 220h, in the middle interlayer insulating layer 114. That is, from the plan view perspective, no capacitor structure may be disposed between the second terminal pad 240 and the third capacitor structure 220.

In the semiconductor device 5 according to example embodiments of the present inventive concepts, no capacitor structure that overlaps with the second terminal pad 240 may be disposed in the interlayer insulating layer 110.

A circumference 340c of the third terminal pad 340 may be defined by being connected with a side wall 340s of the third terminal pad. Because the fourth capacitor structure 320 does not include a through-hole on (or within) the periphery of the third terminal pad 340, the circumference 340c of the third terminal pad 340 may meet (or extend to) the fourth capacitor structure 320.

The fourth capacitor structure 320 disposed below the third terminal pad 340 may overlap with the third terminal pad 340. In other words, the third terminal pad 340 may entirely overlap with the fourth capacitor structure 320.

The passivation layer 130 may be disposed on the interlayer insulating layer 110, the second terminal pad 240, and the third terminal pad 340. The passivation layer 130 may include a second opening 130t-1 that exposes a part of the second terminal pad 240 and a third opening 130t-1 that exposes a part of the third terminal pad 340.

A second conductive adhesive layer 245 may be interposed between the second terminal pad 240 and a second external terminal 250, and a third conductive adhesive layer 345 may be interposed between the third terminal pad 340 and a third external terminal 350.

Referring to FIG. 10, a semiconductor device according to example embodiments of the present inventive concepts will be described. For easy description, a difference from the description with reference to FIGS. 7 to 9 will be primarily described.

FIG. 10 is a diagram for describing a semiconductor device according to example embodiments of the present inventive concepts.

Referring to FIG. 10, the semiconductor device 6 according to example embodiments of the present inventive concepts may further include a fifth capacitor structure 225.

The fifth capacitor structure 225 may be disposed between the substrate 100 and the second terminal pad 240, that is, in the interlayer insulating layer 110. The fifth capacitor structure 225 may be disposed on the same level as the third capacitor structure 220 and one surface of the substrate 100.

At least a part of the fifth capacitor structure 225 may overlap with the second terminal pad 240. In the semiconductor device 6 according to example embodiments of the present inventive concepts, the second capacitor structure 225 may entirely overlap with the second terminal pad 240. In other words, from the plan view perspective, the fifth capacitor structure 225 may be entirely disposed in the circumference 240c of the second terminal pad 240.

The extension line EL2 of the side wall 240s of the second terminal pad may not meet (or be immediately adjacent to) the fifth capacitor structure 225. Accordingly, the extension line EL2 of the side wall 240s of the second terminal pad may be separated from the fifth capacitor structure 225.

The fifth capacitor structure 225 may be disposed in the second through-hole 220h. That is, the fifth capacitor structure 225 may be disposed in the circumference 220c of the second through-hole 220h.

In the semiconductor device 6 according to example embodiments of the present inventive concepts, the fifth capacitor structure 225 may, for example, be electrically connected with the lower wire structure 115 and/or the upper wire structure 117.

The fifth capacitor structure 225 may include a fifth lower electrode 226, a fifth capacitor insulating layer 227, and a fifth upper electrode 228 sequentially laminated on the substrate 100. Because a description thereof is substantially similar to the description of the third capacitor structure 220, the description will be omitted below.

The part illustrating the cut line B-B of FIG. 10 may be similar to that of FIG. 4. However, example embodiments of the present inventive concepts are not limited thereto. That is, the part illustrating the cut line B-B of FIG. 10 may be similar to that of FIG. 5 or 6.

Referring to FIGS. 11 to 12, a semiconductor device according to example embodiments of the present inventive concepts will be described. For easy description, a difference from the description with reference to FIGS. 7 to 9 will be primarily described.

FIG. 11 is a diagram for describing a semiconductor device according to example embodiments of the present inventive concepts. FIG. 12 is a cross-sectional view taken along lines B-B and C-C of FIG. 11.

Referring to FIGS. 11 and 12, in the semiconductor device 7 according to example embodiments of the present inventive concepts, a fourth capacitor structure 320 may include a third through-hole 320h. The third through-hole 320h may have a third circumference 320c.

The circumference 340c of the third terminal pad 340 may be defined by being connected with a side wall 340s of the third terminal pad 340. From the plan view perspective, the circumference 340c of the third terminal pad 340 may be positioned in the circumference 320c of the third through-hole 320h.

Therefore, the fourth capacitor structure 320 may be disposed below the periphery of the third terminal pad 340 and may not overlap with the third terminal pad 340.

Because the circumference 340c of the third terminal pad 340 is positioned in the circumference 320c of the third through-hole 320h, an extension line EL3 of the side wall 340s of the third terminal pad may not meet the fourth capacitor structure 320 but may be separated from the fourth capacitor structure 320.

In the semiconductor device 7 according to example embodiments of the present inventive concepts, no capacitor structure in which the lower electrode, the capacitor insulating layer, and the upper electrode are sequentially laminated may be disposed between the circumference 340c of the third terminal pad 340 and the circumference 320c of the third through-hole 320h, in the middle interlayer insulating layer 114. That is, from the plan view perspective, no capacitor structure may be disposed between the third terminal pad 340 and the fourth capacitor structure 320.

In the semiconductor device 7 according to example embodiments of the present inventive concepts, no capacitor structure that overlaps with the third terminal pad 340 may be disposed in the interlayer insulating layer 110.

In FIG. 12, a distance between the extension line EL2 of the side wall 240s of the second terminal pad and the third capacitor structure 220 may be a third distance w1, and a distance between the extension line EL3 of the side wall 340s of the third terminal pad and the fourth capacitor structure 320 may be a fourth distance w2.

In the semiconductor device 7 according to example embodiments of the present inventive concepts, the distance w1 between the extension line EL2 of the side wall 240s of the second terminal pad and the third capacitor structure 220 may be different from the distance w2 between the extension line EL3 of the side wall 340s of the third terminal pad and the fourth capacitor structure 320.

In more detail, the distance w1 between the extension line EL2 of the side wall 240s of the second terminal pad and the third capacitor structure 220 may be larger than the distance w2 between the extension line EL3 of the side wall 340s of the third terminal pad and the fourth capacitor structure 320.

In FIGS. 7 to 9, when it is assumed that the capacitor structure entirely overlaps with the terminal pads, the maximum value of the thermo mechanical stress may be gradually decreased and converged going from the edge towards the center of the semiconductor chip 21.

As the distance between the extension line of the side wall of the terminal pad and the capacitor structure increases, the thermo mechanical stress applied to the capacitor structure may be decreased and converged.

Accordingly, in the semiconductor chip 21 of FIG. 7, the distance between the extension line of the side wall of the terminal pad and the capacitor structure is controlled depending on the position of the terminal pad to converge the thermo mechanical stress applied to the capacitor structure included in the semiconductor device 7 to a set (or predetermined) value.

Referring to FIG. 13, a semiconductor device according to example embodiments of the present inventive concepts will be described. For easy description, a difference from the description with reference to FIGS. 7 to 9 will be primarily described.

FIG. 13 is a schematic plan view of a semiconductor chip including the semiconductor device according to example embodiments of the present inventive concepts. For reference, a cross-sectional view taken along lines B-B and C-C of FIG. 13 may be similar to that of FIG. 9.

Referring to FIG. 13, the semiconductor device 8 according to example embodiments of the present inventive concepts may further include a plurality of capacitor structures 220, 320, 420, and 425.

In the semiconductor device 8 according to example embodiments of the present inventive concepts, the third capacitor structure 220 and the fourth capacitor structure 320 may be connected to each other. That is, the third capacitor structure 220 and the fourth capacitor structure 320 may be capacitors having the same capacitances.

The third upper electrode 223 and the fourth upper electrode 323 may be directly connected to each other, the third capacitor insulating layer 222 and the fourth capacitor insulating layer 322 may be directly connected to each other, and the third lower electrode 221 and the fourth lower electrode 321 may be directly connected to each other.

That is, a shape of the capacitor structure below the periphery of the terminal pad may vary depending on the positions of the second terminal pad 240 and the third terminal pad 340 formed on the same capacitor structures 220 and 320. For example, a region in which the second capacitor structure 220 is not disposed exists below the periphery of the second terminal pad 240, but the third capacitor structure 320 may be disposed below the periphery of the third terminal pad 340.

FIG. 14 is a block diagram of a memory card including the semiconductor devices according to example embodiments of the present inventive concepts.

Referring to FIG. 14, a memory 1210 including the semiconductor device according to various example embodiments of the present inventive concepts may be adopted in a memory card 1200. The memory card 1200 may include a memory controller 1220 that controls data exchange between a host 1230 and the memory 1210. An SRAM 1221 may be used as an operating memory of a central processing unit 1222. A host interface 1223 may include a protocol for the host 1230 to exchange data by accessing the memory card 1200. An error correction code 1224 may detect and correct an error of data read from the memory 1210. A memory interface 1225 may interface with the memory 1210. A central processing unit 1222 may perform an overall control operation associated with data exchange of the memory controller 1220.

FIG. 15 is a block diagram of an information processing system using the semiconductor devices according to example embodiments of the present inventive concepts.

Referring to FIG. 15, the information processing system 1300 may include a memory system 1310 including the semiconductor device according to various example embodiments of the present inventive concepts. The information processing system 1300 may include the memory system 1310, a modem 1320, a central processing unit 1330, a RAM 1340, and a user interface 1350, which is electrically connected with a system bus 1360. The memory system 1310 may include a memory 1311 and a memory controller 1312 and may have the substantially same configuration as the memory card illustrated in FIG. 9. Data processed by the central processing unit 1330 or data received from an external device may be stored in the memory system 1310. The information processing system 1300 may be applied to a memory card, an SSD, a camera image sensor, and various other chipsets. For example, the memory system 1310 may be configured to adopt the SSD and in this case, the information processing system 1300 may stably and reliably process large-capacity data.

FIG. 16 is a block diagram of an electronic apparatus including semiconductor devices according to example embodiments of the present inventive concepts.

Referring to FIG. 16, the electronic apparatus 1400 may include a semiconductor device according to various example embodiments of the present inventive concepts. The electronic apparatus 1400 may be used in wireless communication apparatuses (for example, a PDA, a notebook, a portable computer, a web tablet, a wireless phone, and/or a wireless digital music player) or various apparatuses that transmit and receive information under a wireless communication environment.

The electronic apparatus 1400 may include a controller 1410, an input/output device 1420, a memory 1430, and a wireless interface 1440. Herein, the memory 1430 may include the semiconductor device fabricated according to various example embodiments of the present inventive concepts. The controller 1410 may include a microprocessor, a digital signal processor, or a processor similar thereto. The memory 1430 may be used to store a command (alternatively, user data) processed by the controller 1410. The wireless interface 1440 may be used to transmit and receive data through a wireless data network. The wireless interface 1440 may include an antenna and/or a wireless transceiver. The electronic apparatus 1400 may use third-generation communication system protocols including CDMA, GSM, NADC, E-TDMA, WCDMA, and CDMA2000.

According to example embodiments, there are provided semiconductor devices that enhance reliability of a MIM capacitor by controlling a shape of the MIM capacitor, and a positional relationship between the MIM capacitor and a terminal pad. By separating the MIM capacitor from the terminal pad, failure of the MIM capacitor is reduced, or prevented.

The foregoing is illustrative of example embodiments of the present inventive concepts and is not to be construed as limiting thereof. Although a few example embodiments of the present inventive concept have been described, those skilled in the art will readily appreciate that many modifications are possible in the example embodiments without materially departing from the teachings and advantages of the present inventive concepts. Accordingly, all such modifications are intended to be included within the scope of the present inventive concepts as defined in the claims. Therefore, it is to be understood that the foregoing is illustrative of the present inventive concepts and is not to be construed as limited to the specific example embodiments disclosed, and that modifications to the disclosed example embodiments, as well as other example embodiments, are intended to be included within the scope of the appended claims. Example embodiments of the present inventive concepts are defined by the following claims, with equivalents of the claims to be included therein.

What is claimed is:

1. A semiconductor device, comprising:
   an interlayer insulating layer on a substrate;
   a first capacitor structure in the interlayer insulating layer and including a through-hole, wherein
   the first capacitor structure includes at least one first laminate, the at least one first laminate including a first lower electrode, a first capacitor insulating layer, and a first upper electrode sequentially on the substrate; and
   a conductive layer including a terminal pad on the interlayer insulating layer, the terminal pad not overlapping with the first capacitor structure, and the terminal pad located inside the through-hole in a plan view.

2. The semiconductor device of claim 1, wherein a side wall of the terminal pad is separated from the first capacitor structure by a distance, and
   the distance is from a first line extending downwards from the side wall to the first capacitor structure.

3. The semiconductor device of claim 1, further comprising:
   a second capacitor structure in the interlayer insulating layer,
   wherein the second capacitor structure includes at least one second laminate, the at least one second laminate including a second lower electrode, a second capacitor insulating layer, and a second upper electrode sequentially on the substrate,
   at least a part of the second capacitor structure overlaps with the terminal pad, and
   the first upper electrode and the second upper electrode are separated from each other.

4. The semiconductor device of claim 3, wherein a first height from the substrate to the first capacitor structure is the same as a second height from the substrate to the second capacitor structure.

5. The semiconductor device of claim 3, wherein an entirety of the second capacitor structure overlaps with the terminal pad.

6. The semiconductor device of claim 5, further comprising:
   a wire structure in the interlayer insulating layer,
   wherein the first capacitor structure and the second capacitor structure are electrically connected to the wire structure.

7. The semiconductor device of claim 1, wherein, in a plan view, a circumference of the first capacitor structure is inside a circumference of the terminal pad.

8. A semiconductor device, comprising:
   a first terminal pad on a surface of a substrate;
   a second terminal pad on the surface of the substrate, wherein the second terminal pad is further from edges of the substrate than the first terminal pad;
   a first capacitor structure including a through-hole and being under a periphery of the first terminal pad, wherein the first terminal pad is located inside the through-hole in a plan view, and ends of the first capacitor structure are separated from ends of the first terminal pad in a horizontal direction; and
   a second capacitor structure under the second terminal pad.

9. The semiconductor device of claim 8, wherein, in a plan view, a circumference of the second capacitor structure is inside a circumference of the second terminal pad.

10. The semiconductor device of claim 8, wherein, from a plan view perspective, no capacitor structure is disposed between the first terminal pad and the substrate.

11. The semiconductor device of claim 8, wherein the second capacitor structure overlaps with the second terminal pad, and
    the second capacitor structure is between the second terminal pad and the substrate.

12. The semiconductor device of claim 8, wherein
    the second capacitor structure is below a periphery of the second terminal pad,
    ends of the second capacitor structure are separated from the ends of the second terminal pad in the horizontal direction, and
    a side wall of the first terminal pad is spaced apart from the first capacitor structure by a first distance,
    the first distance is from a first line extending downwards from the side wall of the first terminal pad to the first capacitor structure,
    a side wall of the second terminal pad is spaced apart from the second capacitor structure by a second distance,
    the second distance is from a second line extending downwards from the side wall of the second terminal pad to the second capacitor structure, and
    the first distance is different than the second distance.

13. The semiconductor device of claim 12, wherein the first distance is larger than the second distance.

14. The semiconductor device of claim 8, wherein, from a plan view perspective, the first and second capacitor structures are excluded from an area between the first terminal pad and the first capacitor structure.

15. The semiconductor device of claim 8, wherein the first capacitor structure includes at least one first laminate, the at least one first laminate including a first lower electrode, a first capacitor insulating layer, and a first upper electrode sequentially on the substrate, and
    the second capacitor structure includes at least one second laminate, the at least one second laminate including a second lower electrode, a second capacitor insulating layer, and a second upper electrode sequentially on the substrate.

16. The semiconductor device of claim 15, wherein the first lower electrode and the second lower electrode are directly connected to each other, the first capacitor insulating layer and the second capacitor insulating layer are directly connected to each other, and the first upper electrode and the second upper electrode are directly connected to each other.

17. The semiconductor device of claim 8, wherein the substrate includes a first region and a second region, the first region surrounds a periphery of the second region, and the first terminal pad is in the first region and the second terminal pad is in the second region.

18. A semiconductor device, comprising:

an interlayer insulating layer on a substrate;

a terminal pad on the interlayer insulating layer; and a first capacitor structure including a through-hole and being within the interlayer insulating layer and on a first region of the substrate, the terminal pad being located inside the through-hole in a plan view, and the first region being spaced apart from a periphery of the terminal pad in a horizontal direction.

19. The semiconductor device of claim 18, wherein opposing ends of the terminal pad extend in the horizontal direction such that nearest ends of the first capacitor structure are exposed.

20. The semiconductor device of claim 18, further comprising:

a plurality of capacitor structures including the first capacitor structure, wherein the plurality of capacitor structures are over a different region of the substrate than the terminal pad.

* * * * *